(12) United States Patent
Rho

(10) Patent No.: US 7,154,721 B2
(45) Date of Patent: Dec. 26, 2006

(54) ELECTROSTATIC DISCHARGE INPUT PROTECTION CIRCUIT

(75) Inventor: Kwang-Myoung Rho, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/319,252

(22) Filed: Dec. 27, 2005

(65) Prior Publication Data
US 2006/0220135 A1 Oct. 5, 2006

(30) Foreign Application Priority Data
Mar. 31, 2005 (KR) .................. 10-2005-0027399

(51) Int. Cl.
*H02H 3/22* (2006.01)
*H01L 23/62* (2006.01)

(52) U.S. Cl. ............... 361/56; 361/91.1; 361/111; 257/355; 257/357; 257/358; 257/360

(58) Field of Classification Search ............ 361/56; 257/355
See application file for complete search history.

(56) References Cited

U.S. PATENT DOCUMENTS

| | | | |
|---|---|---|---|
| 5,917,689 A * | 6/1999 | English et al. ............ 361/56 |
| 5,942,931 A * | 8/1999 | Yanai .................... 327/313 |
| 6,011,420 A | 1/2000 | Watt et al. | |
| 6,344,412 B1 | 2/2002 | Ichikawa et al. | |
| 6,365,941 B1 | 4/2002 | Rhee | |
| 6,600,198 B1 | 7/2003 | Ohnakado et al. | |
| 6,784,496 B1 * | 8/2004 | Brodsky et al. ............ 257/355 |
| 6,930,501 B1 * | 8/2005 | Bargstadt-Franke et al. ..... 324/763 |
| 7,049,659 B1 * | 5/2006 | Ker et al. ................. 257/344 |
| 7,061,052 B1 * | 6/2006 | Kato ....................... 257/357 |
| 2002/0185688 A1 * | 12/2002 | Wu et al. .................. 257/360 |
| 2005/0003564 A1 * | 1/2005 | Bargstadt-Franke et al. .. 438/14 |

FOREIGN PATENT DOCUMENTS

JP 2003-110031 4/2003

* cited by examiner

*Primary Examiner*—Jerome Jackson
*Assistant Examiner*—José R. Diaz
(74) *Attorney, Agent, or Firm*—Blakely Sokoloff Taylor & Zafman

(57) ABSTRACT

An ESD protection circuit includes: a first metal oxide semiconductor (MOS) transistor discharging an excessive electrostatic current generated between an input pad and an internal circuit, and having a first terminal connected to a ground voltage supply terminal; and a second MOS transistor discharging an electrostatic current generated between the input pad and the internal circuit, and having a gate and a first terminal connected to a bulk terminal of the first MOS transistor. The first terminal is connected to the ground voltage supply terminal through an interconnection line having a parasitic resistance with a predetermined value.

10 Claims, 3 Drawing Sheets

US 7,154,721 B2

ELECTROSTATIC DISCHARGE INPUT PROTECTION CIRCUIT

FIELD OF THE INVENTION

The present invention relates to an electrostatic discharge (ESD) protection circuit; and more particularly, to an ESD protection circuit that prevents damage resulting from static electricity of a semiconductor device.

DESCRIPTION OF RELATED ARTS

Typically, electrostatic discharge (ESD) input protection works by abruptly discharging a large amount of positive electrostatic charges instantaneously generated by the surroundings, such as people and machines, and flows into a semiconductor chip. Thus, the ESD input protection is referred as a defensive circuit preventing an internal circuit from destruction by an influence of the electrostatic charges or efficiency degradation from being generated. The ESD circuit is one of the important circuits necessary to a complementary metal oxide semiconductor (CMOS) chip having a characteristic of very high input impedance.

FIG. 1 is a diagram illustrating a conventional ESD input protection circuit. FIG. 1 will be briefly explained hereinafter.

An N-type metal oxide semiconductor (NMOS) device 1 is connected between an outer input terminal 4, i.e., an input pad, and a ground voltage 8 to protect the ESD of an internal circuit. A P-type metal oxide semiconductor (PMOS) device 2 is connected between the outer input terminal 4 and a power supply voltage 7. An NMOS device 3 is connected between the power supply voltage 7 and the ground voltage 8, and a resistance device 5 is connected between the outer input terminal 4 and an internal circuit 6. In a normal operation, the aforementioned devices operate only as a parasitic capacitance or a parasitic resistance. However, in case that instantaneous electrostatic charges are generated at the outer input terminal 4 or the power supply voltage 7 and the ground voltage 8, the aforementioned devices perform the function of rapidly discharging electrostatic charges flowed from the outside. For instance, as shown in FIG. 1, if it is assumed that only the ground voltage 8 is connected to an outer ground voltage, and a large amount of positive electrostatic charges are flowed from the outer input terminal 4 in a state which the power supply voltage 7 is floating, the flowed positive electrostatic charges are discharged either to the ground voltage 8 by a punch-through phenomenon of the NMOS device 1 or to the ground voltage 8 by a punch-through phenomenon of the NMOS device 3 by passing the power supply voltage 7 through the turn-on PMOS device 2. In this case, a main discharging path is made through the NMOS device 1. As described above, the ESD protection input circuit performs a role in preventing the internal circuit from destruction by rapidly discharging a large amount of the positive electrostatic charges due to a diode turn-on used in the ESD protection circuit or the punch-through phenomenon.

However, as for the conventional ESD input protection circuit, ESD protection capacity depends on current discharging capacity of the aforementioned devices. Accordingly, to improve the current discharging capacity, a size of the aforementioned devices, i.e., a channel width of the aforementioned devices, should be increased. However, in case that the channel width is large, because parasitic electrostatic capacity is increased in a normal circuit operation, a side effect of limiting a high speed operation of the input circuit becomes greater. To limit the side effect below a predetermined level, a standard for the parasitic electrostatic capacity, i.e., the parasitic electrostatic capacity of DDR2, DDRAM, and CIN should be equal to and less than 2 pF per pin, is enacted and controlled by the Joint Electron Device Engineering Council (JEDEC). Accordingly, it is necessary to develop a protection circuit both satisfying the CIN standard and having a good ESD capacity.

SUMMARY OF THE INVENTION

It is, therefore, an object of the present invention to provide an electrostatic discharge (ESD) protection circuit with low parasitic capacitance and an improved ESD property.

It is another object of the present invention to provide an ESD protection circuit capable of effectively coping with an excessive voltage in a complementary metal oxide semiconductor (CMOS) circuit with high integration and high speed.

In accordance with one aspect of the present invention, an electrostatic discharge (ESD) protection circuit is provided, including: a first metal oxide semiconductor (MOS) transistor discharging an excessive electrostatic current generated between an input pad and an internal circuit, and having a first terminal connected to a ground voltage supply terminal; and a second MOS transistor discharging an electrostatic current generated between the input pad and the internal circuit, and having a gate and a first terminal connected to a bulk terminal of the first MOS transistor, wherein the first terminal is connected to the ground voltage supply terminal through an interconnection line having a parasitic resistance with a predetermined value.

In accordance with another aspect of the present invention, an ESD protection circuit is provided, including: a first MOS transistor discharging an excessive electrostatic current generated between an input pad and an internal circuit and having a first terminal connected to a ground voltage supply terminal; and a second MOS transistor discharging an electrostatic current generated between the input pad and the internal circuit, having a gate and a first terminal commonly connected to a bulk terminal and a gate terminal of the first MOS transistor, wherein the first terminal is connected to the ground voltage supply terminal through an interconnection line having a parasitic resistance with a predetermined value.

In accordance with a further aspect of the present invention, an ESD protection circuit is provided, including: a first MOS transistor discharging an excessive electrostatic current generated between an input pad and an internal circuit, and having a first terminal connected to a ground voltage supply terminal; a second MOS transistor discharging an electrostatic current generated between the input pad and the internal circuit, and having a gate and a first terminal connected to a bulk terminal of the first MOS transistor, wherein the first terminal is connected to the ground voltage supply terminal through an interconnection line having a parasitic resistance with a predetermined value; and a third MOS transistor discharging an electrostatic current generated between the ground voltage supply terminal discharging an excessive electrostatic current and a power voltage supply terminal, and having a bulk terminal connected to the first terminal of the second MOS transistor.

In accordance with still further aspect of the present invention, an ESD protection circuit is provided, including: a first MOS transistor discharging an excessive electrostatic current generated between an input pad and an internal circuit, and having a first terminal connected to a power voltage supply terminal; and a second MOS transistor discharging an electrostatic current generated between the input pad and the internal circuit, and having a gate and a first terminal connected to a bulk terminal of the first MOS transistor, wherein the first terminal is connected to the power voltage supply terminal through an interconnection line having a parasitic resistance with a predetermined value.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on certain embodiments of the present invention will be provided with reference to the accompanying drawings.

With reference to attached diagrams, an electrostatic discharge (ESD) protection circuit will be explained in detail.

Figure 1:
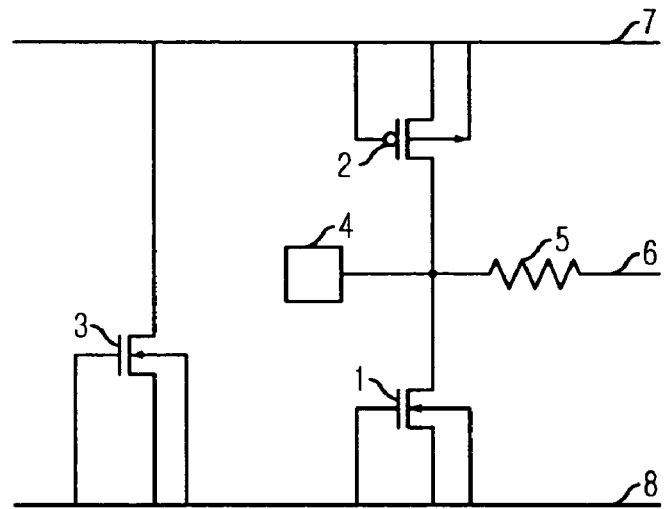
FIG. 1 is a detailed circuit diagram illustrating a conventional electrostatic discharge (ESD) input protection circuit.

The ESD protection circuit in accordance with the present invention lowers a threshold voltage of a main discharging device corresponding to the conventional N-type metal oxide semiconductor (NMOS) device 1 shown in FIG. 1, providing a main characteristic in improving a discharging capacity of the main discharging device. Furthermore, to lower the threshold voltage of the main discharging device corresponding to the conventional NMOS device 1 of FIG. 1, a method for increasing a well voltage of the conventional NMOS device 1 by using a parasitic resistance effect existing on a discharging path of another NMOS device with a size much less than the conventional NMOS device 1 is used.

Figure 2:
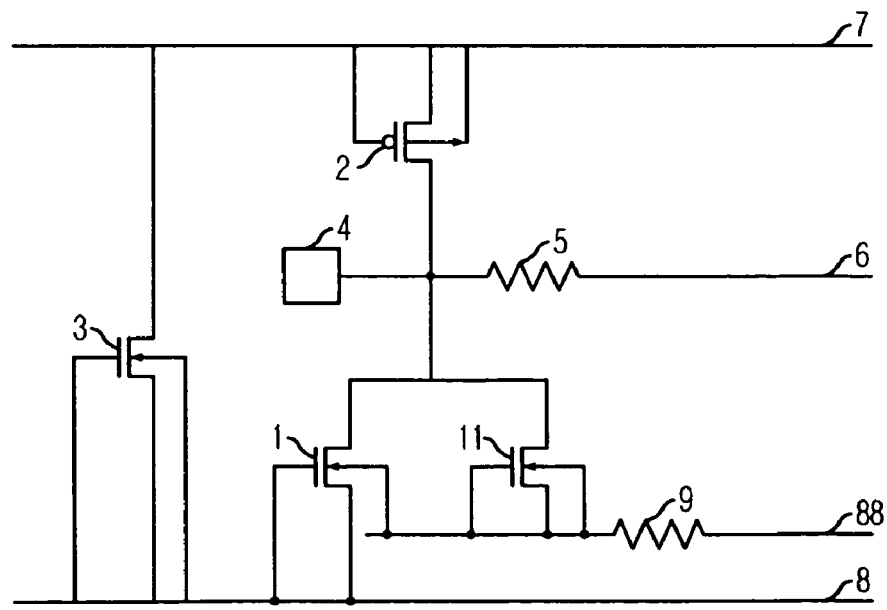
FIG. 2 is a detailed circuit diagram illustrating an ESD input protection circuit in accordance with an embodiment of the present invention.

With reference to FIG. 2 illustrating an embodiment of the present invention, the ESD protection circuit in accordance with the present invention will be examined. FIG. 2 uses the same reference numerals with respect to the same constitution elements shown in FIG. 1.

FIG. 2 illustrates that a technical principle of the present invention is applied to the conventional NMOS device 1 shown in FIG. 1. The similar principle also can be applied to the conventional P-type metal oxide semiconductor (PMOS) device 2 or the conventional NMOS device 3. The difference between the ESD circuit in accordance with this embodiment of the present invention and the conventional ESD circuit is as follows. First, an NMOS device 11 is added as a small supplementary discharging device besides an NMOS device 1 which is the main discharging device. As a discharging path of the added NMOS device 11, a thin ground voltage 88 is connected to a source terminal. It is necessary that the new ground voltage 88 is connected in an appropriately thin interconnection line to obtain a desirable effect of the present invention. Since the new ground voltage 88 is a relatively thin interconnection line, a parasitic resistance element may exist. A substrate terminal of the NMOS device 1, which is the main discharging device, is connected to the aforementioned thin ground voltage 88.

An operation of FIG. 2 is explained as follows. In a normal operation, discharging devices are regarded only as a parasitic electrostatic capacitance, and an existing ground voltage 8 and the new ground voltage 88 have the identical ground electric potential. To examine an ESD state, it is assumed that a large amount of positive electrostatic charges are inflowed from an outer input terminal 4, and the two ground voltages 8 and 88 are connected to an outer ground voltage. At this time, the two discharging devices, i.e., the two NMOS devices 1 and 11, start to discharge the positive electrostatic charges in the identical speed due to a punch-through phenomenon. However, although the same amount of the positive electrostatic charges is discharged, the electric potential of the ground voltage 88 is raised due to a parasitic resistance of the ground voltage 88 using the thin interconnection line. The raised electric potential increases a substrate voltage of the main discharge device which is the NMOS device 1, reducing the threshold voltage of the NMOS device 1 and abruptly increasing a punch-through current of the NMOS device 1 in result. Accordingly, it is possible to increase an ESD capacity without a large increase in channel width of the NMOS device 1, which is the main discharging device. Accordingly, it is also possible to fabricate the ESD protection circuit not only having a good ESD property but also satisfying a standard of an input electrostatic capacitance in an operation condition.

Figure 3:
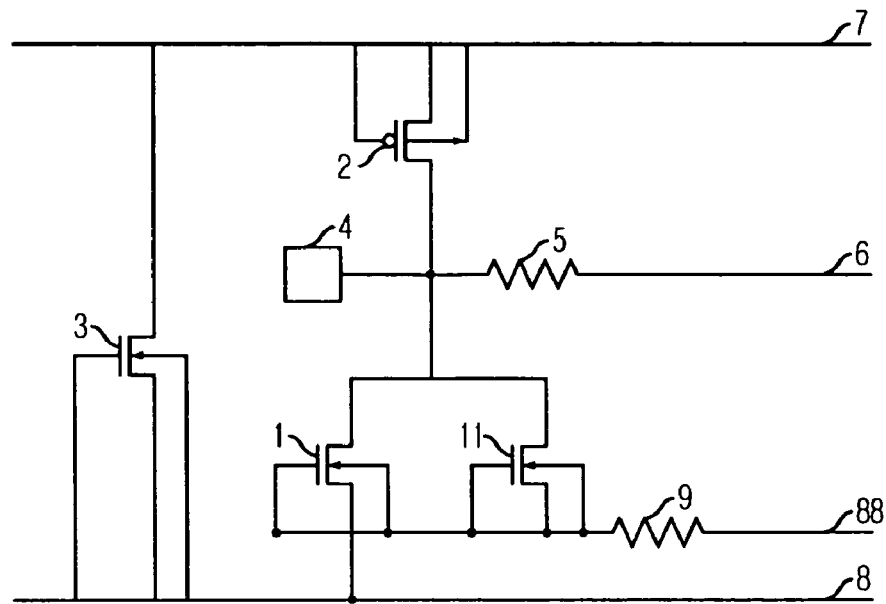
FIG. 3 is a detailed circuit diagram illustrating an ESD input protection circuit in accordance with another embodiment of the present invention.

FIG. 3 is a diagram illustrating another embodiment of the present invention. Herein, the same reference numerals with respect to the same constitution elements shown in FIG. 2 are used. FIG. 3 is similar with FIG. 2; however, a ground voltage 88 formed by using a thin interconnection line is connected up to a gate terminal of an NMOS device 1 which is a main discharging device. Thus, it is attempted to obtain a reducing effect of a threshold voltage of the NMOS device 1 during discharging the electrostatic charges along with an increasing effect of a gate electric potential.

Figure 4:
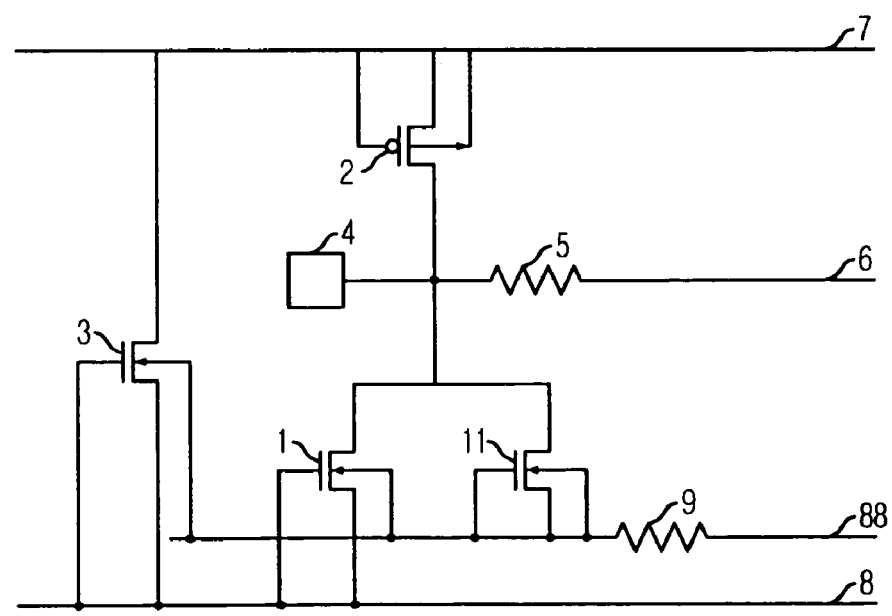
FIG. 4 is a detailed circuit diagram illustrating an ESD input protection circuit in accordance with yet another embodiment of the present invention.

FIG. 4 is a diagram illustrating another embodiment of the present invention. Herein, the same reference numerals with respect to the same constitution elements shown in FIG. 2 are used. In order to increase a substrate voltage of a discharging NMOS device 3 interposed between a power supply voltage 7 and a ground voltage 8, a ground voltage 88 is formed by using a thin interconnection line connected to a gate terminal of the NMOS device 3, attempting to reduce a threshold voltage of the NMOS device 3.

Figure 5:
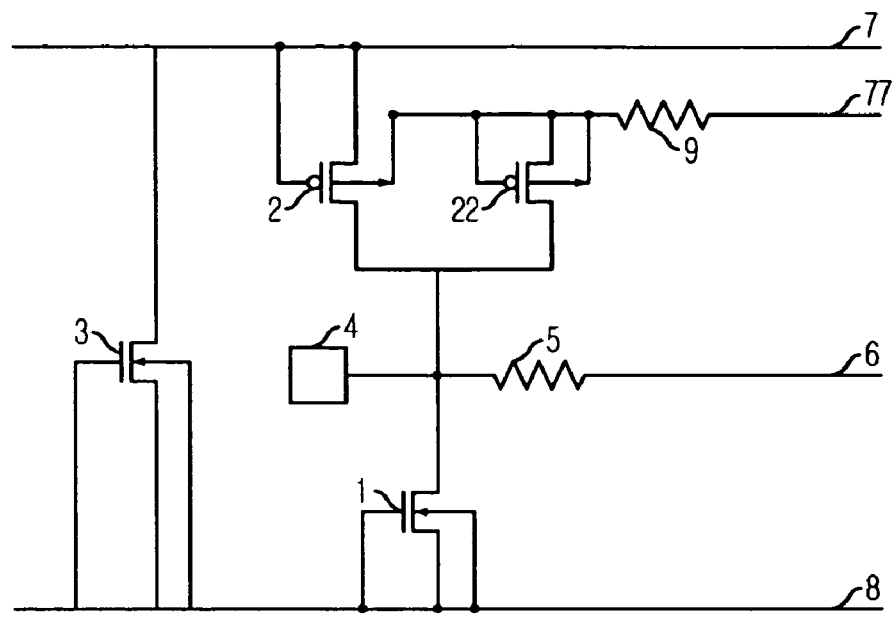
FIG. 5 is a detailed circuit diagram illustrating an ESD input protection circuit in accordance with still another embodiment of the present invention.

FIG. 5 is a diagram illustrating still another embodiment of the present invention. Herein, the same reference numerals with respect to the same constitution elements shown in FIG. 2 are used. To obtain an effect in reducing a threshold voltage of a discharging PMOS device 2 placed between an outer input terminal 4 and a power supply voltage 7, a supplementary discharging PMOS device 22 is added, and the supplementary discharging PMOS device 22 is connected between a thin power supply voltage 77 and the outer input terminal 4.

Figure 6:
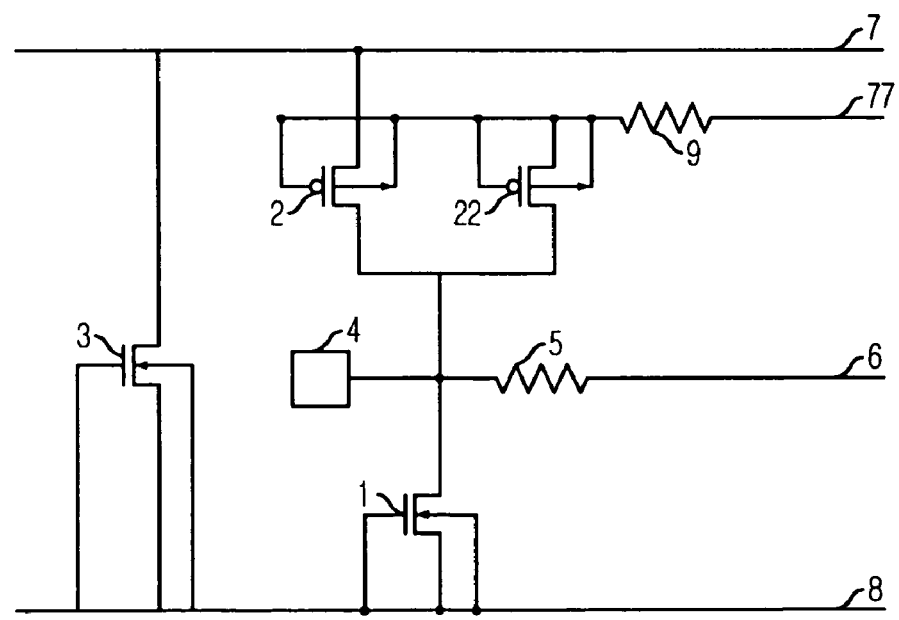
FIG. 6 is a detailed circuit diagram illustrating an ESD input protection circuit in accordance with yet another embodiment of the present invention.

Meanwhile, FIG. 6 is a diagram illustrating yet another embodiment of the present invention. Herein, the same reference numerals with respect to the same constitution elements shown in FIG. 2 are used. A well terminal of a PMOS device 2, which is a main discharging device, is connected to a thin power supply voltage 77.

In an early stage in which discharging the electrostatic charges starts, a voltage drop of the thin power supply voltage 77 is generated by a current discharged through a PMOS device 22, which is a supplementary discharging device. This voltage drop decreases a well voltage of the PMOS device 2, which is the main discharging device. Thus, the decreased well voltage of the PMOS device 2 reduces a threshold voltage of the PMOS device 2 and thus, a discharging capacity is improved. That is, the technical principle of the present invention is applied to the PMOS device 2.

The present invention provides a method for improving ESD discharging capacity without increasing a channel width of a discharging device. Thus, the present invention meets a standard of an input terminal electrostatic capacitance; makes an input circuit operate in high speed; and provides an effect in preventing degradation of an ESD property. Accordingly, the present invention can be usefully applied to the _SD protection circuit of a high speed CMOS circuit.

The present application contains subject matter related to the Korean patent application No. KR 2005-0027399, filed in the Korean Patent Office on Mar. 31, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An electrostatic discharge (ESD) protection circuit, comprising:
   a first metal oxide semiconductor (MOS) transistor discharging an excessive electrostatic current generated between an input pad and an internal circuit, and having a first terminal connected to a ground voltage supply terminal; and
   a second MOS transistor discharging an electrostatic current generated between the input pad and the internal circuit, and having a gate and a first terminal connected to a bulk terminal of the first MOS transistor, wherein the first terminal of the second MOS transistor is connected to the ground voltage supply terminal through an interconnection line having a parasitic resistance with a predetermined value.

2. The ESD protection circuit of claim 1, wherein the first MOS transistor is an N-type metal oxide semiconductor (NMOS) transistor.

3. An ESD protection circuit, comprising:
   a first MOS transistor discharging an excessive electrostatic current generated between an input pad and an internal circuit and having a first terminal connected to a ground voltage supply terminal; and
   a second MOS transistor discharging an electrostatic current generated between the input pad and the internal circuit, having a gate and a first terminal commonly connected to a bulk terminal and a gate terminal of the first MOS transistor, wherein the first terminal of the second MOS transistor is connected to the ground voltage supply terminal through an interconnection line having a parasitic resistance with a predetermined value.

4. The ESD protection circuit of claim 3, wherein the first MOS transistor is an NMOS transistor.

5. An ESD protection circuit, comprising:
   a first MOS transistor discharging an excessive electrostatic current generated between an input pad and an internal circuit, and having a first terminal connected to a ground voltage supply terminal;
   a second MOS transistor discharging an electrostatic current generated between the input pad and the internal circuit, and having a gate and a first terminal connected to a bulk terminal of the first MOS transistor, wherein the first terminal of the second MOS transistor is connected to the ground voltage supply terminal through an interconnection line having a parasitic resistance with a predetermined value; and
   a third MOS transistor discharging an electrostatic current generated between the ground voltage supply terminal and a power voltage supply terminal, and having a bulk terminal connected to the first terminal of the second MOS transistor.

6. The ESD protection circuit of claim 5, wherein the first MOS transistor is an NMOS transistor.

7. An ESD protection circuit, comprising:
   a first MOS transistor discharging an excessive electrostatic current generated between an input pad and an internal circuit, and having a first terminal connected to a power voltage supply terminal; and
   a second MOS transistor discharging an electrostatic current generated between the input pad and the internal circuit, and having a gate and a first terminal connected to a bulk terminal of the first MOS transistor, wherein the first terminal of the second MOS transistor is connected to the power voltage supply terminal through an interconnection line having a parasitic resistance with a predetermined value.

8. The ESD protection circuit of claim 7, wherein the first MOS transistor is a P-type metal oxide semiconductor (PMOS) transistor.

9. An ESD protection circuit, comprising:
   a first MOS transistor discharging an excessive electrostatic current generated between an input pad and an internal circuit, and having a first terminal connected to a power voltage supply terminal; and
   a second MOS transistor discharging an electrostatic current generated between the input pad and the internal circuit, and having a gate and a first terminal commonly connected to a bulk terminal and a gate terminal of the first MOS transistor, wherein the first terminal of the second MOS transistor is connected to the power voltage supply terminal through an interconnection line having a parasitic resistance with a predetermined value.

10. The ESD protection circuit of claim 9, wherein the first MOS transistor is a PMOS transistor.

* * * * *